US010492311B2

(12) United States Patent
Liu et al.

(10) Patent No.: US 10,492,311 B2
(45) Date of Patent: Nov. 26, 2019

(54) FLEXIBLE DISPLAY DEVICE

(71) Applicant: Boe Technology Group Co., Ltd., Beijing (CN)

(72) Inventors: Lu Liu, Beijing (CN); Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 30 days.

(21) Appl. No.: 15/322,572

(22) PCT Filed: Aug. 10, 2016

(86) PCT No.: PCT/CN2016/094370
§ 371 (c)(1),
(2) Date: Dec. 28, 2016

(87) PCT Pub. No.: WO2017/113806
PCT Pub. Date: Jul. 6, 2017

(65) Prior Publication Data

US 2018/0035554 A1 Feb. 1, 2018

(30) Foreign Application Priority Data

Dec. 31, 2015 (CN) .......................... 2015 1 1034028

(51) Int. Cl.
*H05K 5/00* (2006.01)
*G09F 9/30* (2006.01)

(52) U.S. Cl.
CPC ........... *H05K 5/0017* (2013.01); *G09F 9/301* (2013.01)

(58) Field of Classification Search
None
See application file for complete search history.

(56) References Cited

U.S. PATENT DOCUMENTS 4,900,135 A * 2/1990 Yuasa .................... B41M 5/363 359/241
9,759,979 B2 * 9/2017 Wu ......................... G02F 1/167
(Continued)

FOREIGN PATENT DOCUMENTS

CN 103681759 A 3/2014
CN 103927941 A 7/2014
(Continued)

OTHER PUBLICATIONS

Search Report for International Application No. PCT/CN2016/094370 dated Oct. 27, 2016.
(Continued)

*Primary Examiner* — Ryan Crockett
(74) *Attorney, Agent, or Firm* — Calfee, Halter & Griswold LLP

(57) ABSTRACT

The present disclosure provides a flexible display device, wherein there is a flexible support structure fixed on a surface of the flexible display module, which is used to disperse stress. During use of the flexible display device, the flexible support structure can be used to disperse the point force or linear force that the flexible display device is subject to when being bent into even planar force. Besides, the flexible support structure can reduce the stress exerted on the flexible display module, avoiding delamination among the film layers caused by local stress concentration on the flexible display module. In addition, given the same thickness of the flexible display module, the flexible display device can be bent to a smaller bending radius.

6 Claims, 3 Drawing Sheets

(56) References Cited

U.S. PATENT DOCUMENTS

| | | | | |
|---|---|---|---|---|
| 2006/0291030 | A1* | 12/2006 | Niiyama | G02F 1/13336 359/237 |
| 2009/0115942 | A1* | 5/2009 | Watanabe | G02F 1/133305 349/96 |
| 2014/0077181 | A1* | 3/2014 | Kim | G02F 1/133608 257/40 |
| 2015/0145755 | A1* | 5/2015 | Yamazaki | G09G 3/32 345/76 |
| 2015/0181731 | A1 | 6/2015 | Lin et al. | |
| 2015/0314561 | A1 | 11/2015 | Kim et al. | |
| 2016/0014883 | A1 | 1/2016 | Cho et al. | |
| 2016/0116817 | A1* | 4/2016 | Wu | G02F 1/167 359/296 |
| 2017/0025642 | A1* | 1/2017 | Li | H01L 51/5271 |
| 2017/0040392 | A1* | 2/2017 | Wang | H01L 23/564 |

FOREIGN PATENT DOCUMENTS

| | | | |
|---|---|---|---|
| CN | 104134660 | * | 11/2014 |
| CN | 104134660 | A | 11/2014 |
| CN | 204144262 | U | 2/2015 |
| CN | 104733507 | A | 6/2015 |
| CN | 104779265 | A | 7/2015 |
| CN | 105609006 | A | 5/2016 |
| CN | 205264263 | U | 5/2016 |
| WO | 2014137113 | A1 | 9/2014 |

OTHER PUBLICATIONS

First Office Action for Chinese Patent Application No. 201511034028.8 dated Sep. 30, 2017.

* cited by examiner

FLEXIBLE DISPLAY DEVICE

RELATED APPLICATIONS

The present application is the US National Stage of International Application No. PCT/CN2016/094370, filed on Aug. 10, 2016, which claims the benefit of Chinese Patent Application No. 201511034028.8, filed on Dec. 31, 2015, the entire disclosure of which is incorporated herein by reference.

BACKGROUND OF THE DISCLOSURE

1. Field of the Disclosure

The present disclosure relates to the technical field of flexible display, and in particular to a flexible display device.

2. Description of the Prior Art

Currently, bendable or foldable flexible display modules have been developed. Such flexible display module is a multi-film layer structure. For example, a flexible display panel employing an electroluminescent structure as a basic design generally comprises a back film, a pixel control circuit, an electroluminescent pixel member, a water-oxygen barrier layer (BF), a circular polarizing plate (C-POL), a touch member and a protective cover plate (HC) and other film layers stacked together. The entire thickness of the display module is generally about 50-1500 μm.

In an electroluminescent pixel member of the flexible display module, the adhesion force between a cathode and a light emitting layer is Van der Waals' force. Comparing the adhesion force between other film layers, this adhesion force is very weak. In the repeated bending processes, the cathode and the light emitting layer can be easily delaminated. As shown in FIG. 1, during use, the flexible display module can be subject to force (called point force or linear force hereinafter) at point regions or linear regions. Therefore, the delamination of film layers easily occurs in the bending process due to local stress concentration.

SUMMARY OF THE DISCLOSURE

In view of this, an embodiment of the present disclosure provides a flexible display device which can solve the problem of delamination of the film layers caused by stress concentration during use of the flexible display module.

Therefore, an embodiment of the present disclosure provides a flexible display device comprising a flexible display module and a flexible support structure fixed on a surface of the flexible display module, which is used to disperse stress.

In a possible implementation, in the above flexible display device according to the embodiment of the present disclosure, the flexible display module is a flexible display panel, and the flexible support structure comprises: a first flexible support portion fixed on the display surface of the flexible display panel and a second flexible support portion fixed on the back face of the flexible display panel.

In a possible implementation, in the above flexible display device according to the embodiment of the embodiment of the present disclosure, the flexible display panel is provided with a protective cover plate to protect the display surface, and the cover plate can be used instead of the first flexible support portion. In this way, there is no need to provide an additional first flexible support portion.

In a possible implementation, in the above flexible display device according to the embodiment of the embodiment of the present disclosure, the first flexible support portion is an upper cover plate fixed on the display surface of the flexible display panel.

In a possible implementation, in the above flexible display device according to the embodiment of the embodiment of the present disclosure, the second flexible support portion is a lower support plate fixed on the entire back face of the flexible display panel.

In a possible implementation, in the above flexible display device according to the embodiment of the embodiment of the present disclosure, the inner portion of the lower support plate is provided with at least one hollow region, thereby forming a rib-shaped support skeleton to improve the bending performance of the second flexible support portion.

In a possible implementation, in the above flexible display device according to the embodiment of the embodiment of the present disclosure, the number of the hollow regions can be a plurality and each of the hollow regions is arranged side by side in a longitudinal direction, or each of the hollow regions is stacked along a direction perpendicular to the flexible display panel.

In a possible implementation, in the above flexible display device according to the embodiment of the embodiment of the present disclosure, the second flexible support portion is at least one strip-shaped lower support bar.

In a possible implementation, in the above flexible display device according to the embodiment of the embodiment of the present disclosure, the lower support bar is in elongate strip form, and when the flexible display panel is bent, the lower support bar bears bending moment.

In a possible implementation, in the above flexible display device according to the embodiment of the embodiment of the present disclosure, the flexible display panel can be any one of an electroluminescent display panel, an electrophoretic display panel, an electrowetting display panel and a liquid crystal display panel.

The beneficial effects of the embodiments of the present disclosure comprise:

the present disclosure provides a flexible display device, wherein there is a flexible support structure fixed on the surface of the flexible display module, which is used to disperse stress. During use of the flexible display device, the flexible support structure can be used to disperse the point force or linear force that the flexible display device is subject to when being bent into even planar force (that is, force is exerted on planar region). Besides, the flexible support structure can reduce the stress exerted on the flexible display module, avoiding delamination of the film layers caused by local stress concentration on the flexible display module. In addition, given the same thickness of the flexible display module, the flexible display device can be bent to a smaller bending radius.

DETAILED DESCRIPTION OF THE PRESENT DISCLOSURE

Figure 1:
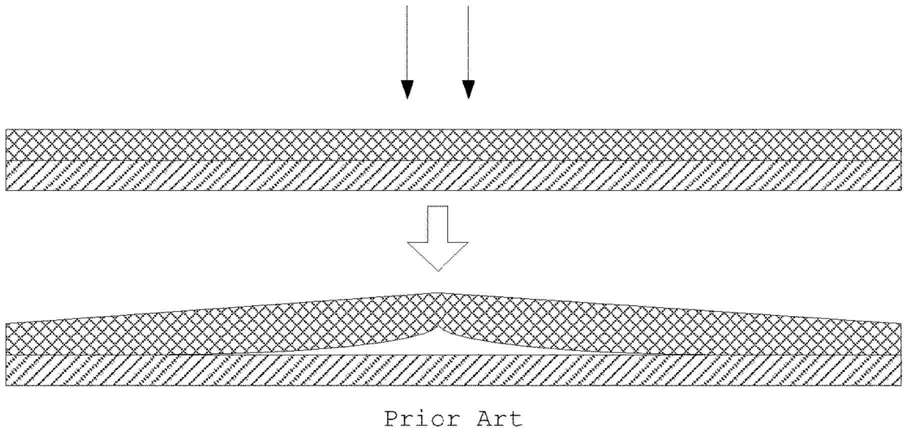
FIG. 1 is a schematic force diagram of a flexible display module in prior art.

The specific implementations of the flexible display device according to the embodiments of the present disclosure will be described in detail with reference to the drawings.

The thickness and shape of each of the film layers do not reflect the true scale of the flexible display device and is only used to illustrate the present disclosure.

An embodiment of the present disclosure provides a flexible display device, comprising a flexible display module and a flexible support structure fixed on the surface of the flexible display module, which is used to disperse stress.

In the flexible display device according to the embodiment of the present disclosure, there is a flexible support structure fixed on the surface of the flexible display module, which is used to disperse stress. During use of the flexible display device, the flexible support structure can be used to disperse the point force or linear force that the flexible display device is subject to when being bent into even planar force. Besides, the flexible support structure can reduce the stress exerted on the flexible display module, avoiding delamination of the film layers caused by local stress concentration on the flexible display module. In addition, given the same thickness of the flexible display module, the flexible display device can be bent to a smaller bending radius.

In implementation, the flexible display module according to the embodiment of the present disclosure in particular can be a flexible display panel. Then as shown FIG. 2, the flexible support structure generally comprises a first flexible support portion 02 fixed on the display surface of the flexible display panel 01 and a second flexible support portion 03 fixed on the back face of the flexible display panel 01.

In specific implementation, the flexible display panel 01 can be any one of an electroluminescent display panel, an electrophoretic display panel, an electrowetting display panel and a liquid crystal display panel, which will not be restricted herein.

The following description takes the flexible display module as the flexible display panel as an example to illustrate the present disclosure.

In implementation, in the above flexible display device according to the embodiment of the present disclosure, the first flexible support portion 02 can be in various specific forms. For example, the first flexible support portion 02 can be an upper cover plate fixed on the display surface of the flexible display panel 01. The upper cover plate can disperse the point force or linear force exerted from above into even planar force and then can exert the even planar force onto the display surface of the flexible display panel 01. Besides, the upper cover plate can reduce the stress exerted from above onto the flexible display panel 01, avoiding the delamination of the film layers caused by stress concentration on the flexible display panel 01.

Furthermore, in specific implementation, in the above flexible display device according to the embodiment of the present disclosure, adding an upper cover plate onto the display surface of the flexible display panel 01 may increase the entire module thickness of the flexible display device. Therefore, if the original internal structure of the flexible display panel 01 has been provided with a protective cover plate on the display surface, in order to meet the requirement that the module thickness of the flexible display device should be small, the original protective cover plate provided on the display surface of the flexible display panel 01 can directly be used as the first flexible support portion 02. That is, no upper cover plate is separately provided on the display surface of the flexible display panel 01. In this way, the protective cover plate in the uppermost layer of the flexible display panel 01 can disperse the point force or linear force exerted from above into even planar force and then can exert the even planar force onto other film layers of the flexible display panel 01. Besides, the protective cover plate can reduce the stress exerted onto other film layers of the flexible display panel 01 from above, avoiding the delamination of other film layers caused by stress concentration on the flexible display panel 01.

Figure 2:
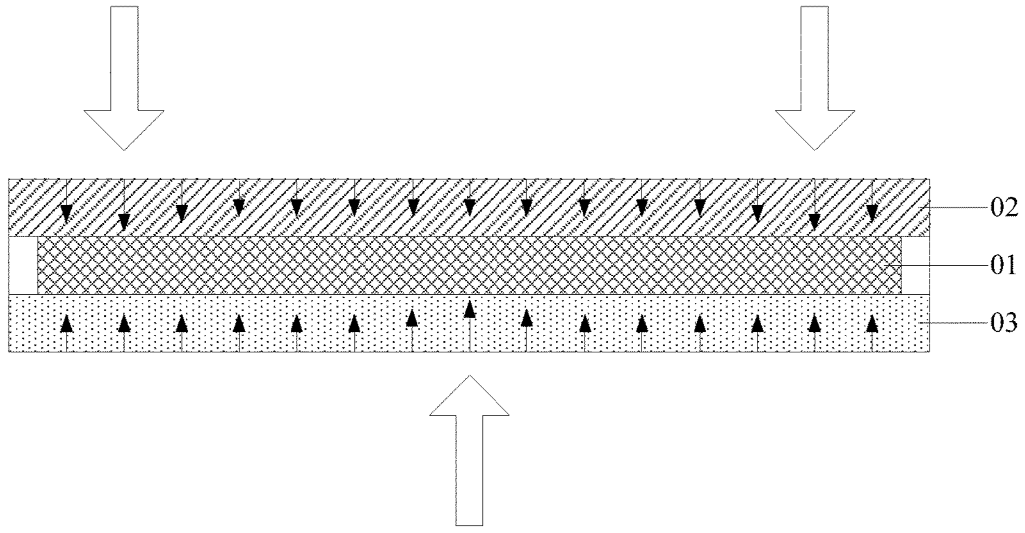
FIG. 2 is a schematic view of a flexible display device structure according to an embodiment of the present disclosure.

In implementation, in the flexible display device according to the embodiment of the present disclosure, the second flexible support portion 03 can be in various specific forms. For example, as shown in FIG. 2, the second flexible support portion 03 can be a lower support plate fixed on the entire back face of the flexible display panel 01. The lower support plate can disperse the point force or linear force exerted from below into even planar force and then can exert the even planar force onto the back face of the flexible display panel 01. Besides, the lower support plate can reduce the stress exerted onto the flexible display panel 01 from below, avoiding the delamination of film layers caused by stress concentration on the flexible display panel 01.

Figure 3:
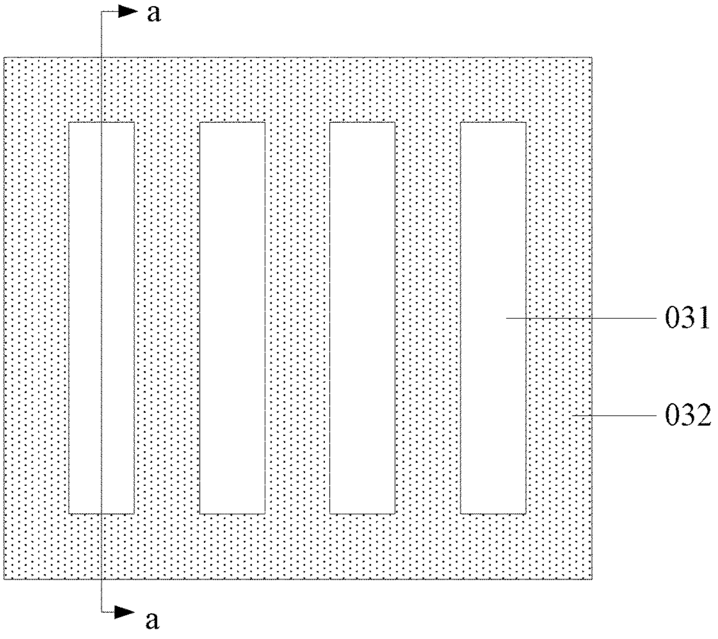
FIG. 3 is a top view of a lower support plate in the flexible display device according to an embodiment of the present disclosure.

In particular, in the above flexible display device according to the embodiment of the present disclosure, the lower support plate as a second flexible support portion 03 can be solid, or alternatively at least one hollow region 031 can be provided inside of the lower support plate as shown in the top plan view in FIG. 3, thereby forming a rib-shaped support skeleton 032 to improve the bending performance of the second flexible support portion 03. The middle support rib of the support skeleton 032 is an elongate strip, which can be considered as a simply supported beam. When force or bending moment is exerted onto the simply supported beam, as shown in FIG. 3 and FIG. 4, the bending direction of the simply supported beam is as follows: the upper side and the lower side of it are bent into the paper while the middle section of the simply supported beam bulges out of the paper; or alternatively, the upper side and the lower side are bent out of the paper while the middle section of the simply supported beam is concave into the paper.

Figure 4:
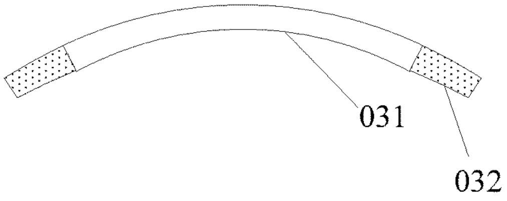
FIG. 4 is a sectional view of the lower support plate in bent state taken along a line a-a in FIG. 3.
Figure 5:
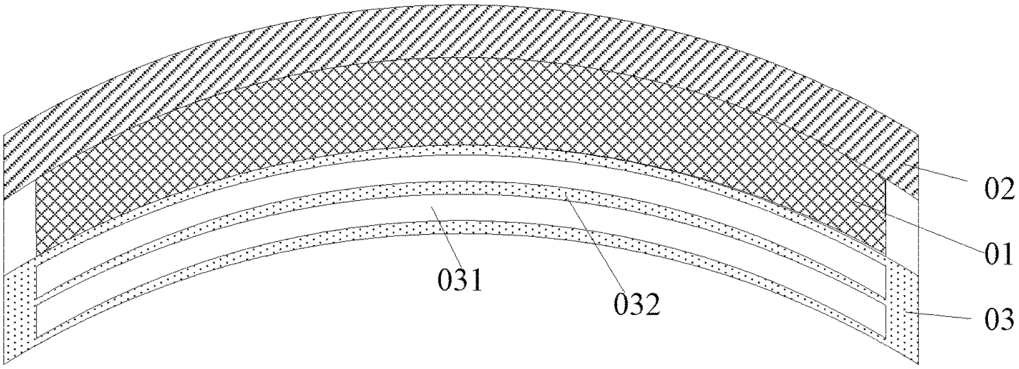
FIG. 5 is a schematic view of the flexible display device structure according to another embodiment of the present disclosure.

Furthermore, in the flexible display device according to the embodiment of the present disclosure, in order to let the lower support plate to disperse stress in a better way, as shown in FIG. 3 and FIG. 4, the number of the hollow regions 031 in the lower support plate can be a plurality and each of the hollow regions 031 is arranged side by side in the longitudinal direction. Or alternatively, as shown in FIG. 5, each of the hollow regions 031 is stacked along a direction perpendicular to the flexible display panel 01.

Figure 6:
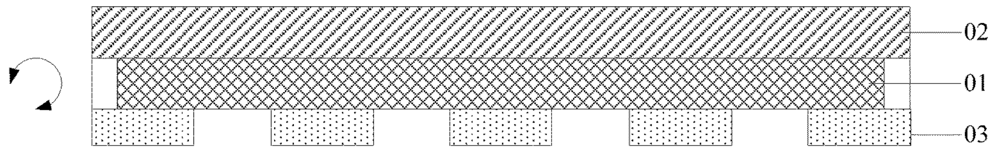
FIG. 6 is a schematic view of the flexible display device structure according to another embodiment of the present disclosure.

In implementation, in the flexible display device according to the embodiment of the present disclosure, another form of the second flexible support portion 03 can be at least one strip-shaped lower support bar, as shown in FIG. 6, that is, the second flexible support portion 03 is not disposed on the entire back face of the flexible display panel 01, but can be a plurality of discrete strip-shaped lower support bars.

Furthermore, in order to let the second flexible support portions 03 disperse the stress exerted from below in a better way, as shown in FIG. 6, the lower support bars as the second flexible support portion 03 can be in elongate strip form. When the lower support bars are bent in the direction shown by the arrow in FIG. 6, the lower support bars bear bending moment. The bending direction of the lower support bar can be as follows: the end face facing towards the viewer and the end face facing away from the viewer can be bent downwards while the middle section of the lower support bar bugles upwards; or alternatively the end face facing towards the viewer and the end face facing away from the viewer can be bent upwards while the middle section of the lower support bar is concave downwards.

The present disclosure provides a flexible display device, wherein there is a flexible support structure fixed on the surface of the flexible display module, which is used to disperse stress. During use of the flexible display device, the flexible support structure can be used to disperse the point force or linear force that the flexible display device is subject to when being bent into even planar force. Besides, the flexible support structure can reduce the stress exerted on the flexible display module, avoiding delamination of the film layers caused by local stress concentration on the flexible display module. In addition, given the same thickness of the flexible display module, the flexible display device can be bent to a smaller bending radius.

Obviously, various modifications and variations can be made to the present disclosure without departing from the scope and spirit of the present disclosure. If those modifications and variations made to the present disclosure are within the scope of the claims or equivalents thereof, the present disclosure is intended to comprise all these modifications and variations.

What is claimed is:

1. A flexible display device, comprising:

a flexible display panel with a display surface and a back surface, a first flexible support portion fixed on a display surface of the flexible display panel, and a second flexible support structure portion fixed on the back surface of the flexible display panel, wherein the second flexible support portion is a lower support plate fixed on the entire back face of the flexible display panel, an inner portion of the lower support plate is provided with a plurality of hollow regions, thereby forming a rib-shaped support skeleton to improve the bending performance of the second flexible support portion, wherein orthographic projection regions of the rib-shaped support skeleton on the flexible display panel are a plurality of rib-shaped regions which overlap a region where the flexible display panel covers, and wherein the plurality of hollow regions are stacked in a direction perpendicular to the back surface of the flexible display panel to form a plurality of layers of hollow regions, and each of the hollow regions extends in a direction parallel to the back surface of the flexible display panel within the inner portion of the lower support plate.

2. The flexible display device according to claim 1, wherein the flexible display panel is provided with a protective cover plate to protect the display surface, and the first flexible support portion is the protective cover plate.

3. The flexible display device according to claim 2, wherein the flexible display panel is any one of an electroluminescent display panel, an electrophoretic display panel, an electrowetting display panel and a liquid crystal display panel.

4. The flexible display device according to claim 1, wherein the first flexible support portion is an upper cover plate fixed on the display surface of the flexible display panel.

5. The flexible display device according to claim 4, wherein the flexible display panel is any one of an electroluminescent display panel, an electrophoretic display panel, an electrowetting display panel and a liquid crystal display panel.

6. The flexible display device according to claim 1, wherein the flexible display panel is any one of an electroluminescent display panel, an electrophoretic display panel, an electrowetting display panel and a liquid crystal display panel.

* * * * *